United States Patent [19]

Pum et al.

[11] Patent Number: 4,985,803

[45] Date of Patent: Jan. 15, 1991

[54] HOUSING FOR A MULTI-BOARD ELECTRONIC MODULE FOR A PROGRAMMABLE CONTROLLER SYSTEM

[75] Inventors: Frank W. Pum, Hales Corners; Michael C. Szymaszek, Greendale, both of Wis.

[73] Assignee: Square D Company, Palatine, Ill.

[21] Appl. No.: 325,411

[22] Filed: Mar. 17, 1989

[51] Int. Cl.⁵ .............................................. H05K 7/20
[52] U.S. Cl. ..................................... 361/383; 361/391; 361/415; 361/429
[58] Field of Search ................... 211/41; 361/381, 383, 361/384, 390, 391–395, 399, 415, 427, 429

[56] References Cited

U.S. PATENT DOCUMENTS

| | | | |
|---|---|---|---|
| 3,231,785 | 1/1966 | Calabro | 361/383 |
| 4,327,835 | 5/1982 | Leger | 361/399 |
| 4,752,861 | 6/1988 | Niggle et al. | 361/394 |

FOREIGN PATENT DOCUMENTS 3038719 10/1981 Fed. Rep. of Germany ...... 361/383

*Primary Examiner*—Gregory D. Thompson
*Attorney, Agent, or Firm*—Michael J. Femal; Thomas K. Stine

[57] ABSTRACT

A housing for a multi-board electronic module is disclosed. The housing comprises a rear wall, side walls, a top wall and a bottom wall cooperating to define an enclosure having an open front. Brackets located in the enclosure permit mounting of the electronic circuit boards in a substantially vertical orientation. Vent openings in the top and the bottom walls cooperate with the vertically oriented electronic circuit boards to permit air heated by the electronic components located on the circuit boards to escape the housing through the top wall vent openings and for permitting ambient air to enter the bottom wall vent openings. The ambient air replaces the escaping air and cools the components located on the electronic circuit boards. The housing can be either wall mounted or mounted in a register rack assembly.

7 Claims, 4 Drawing Sheets

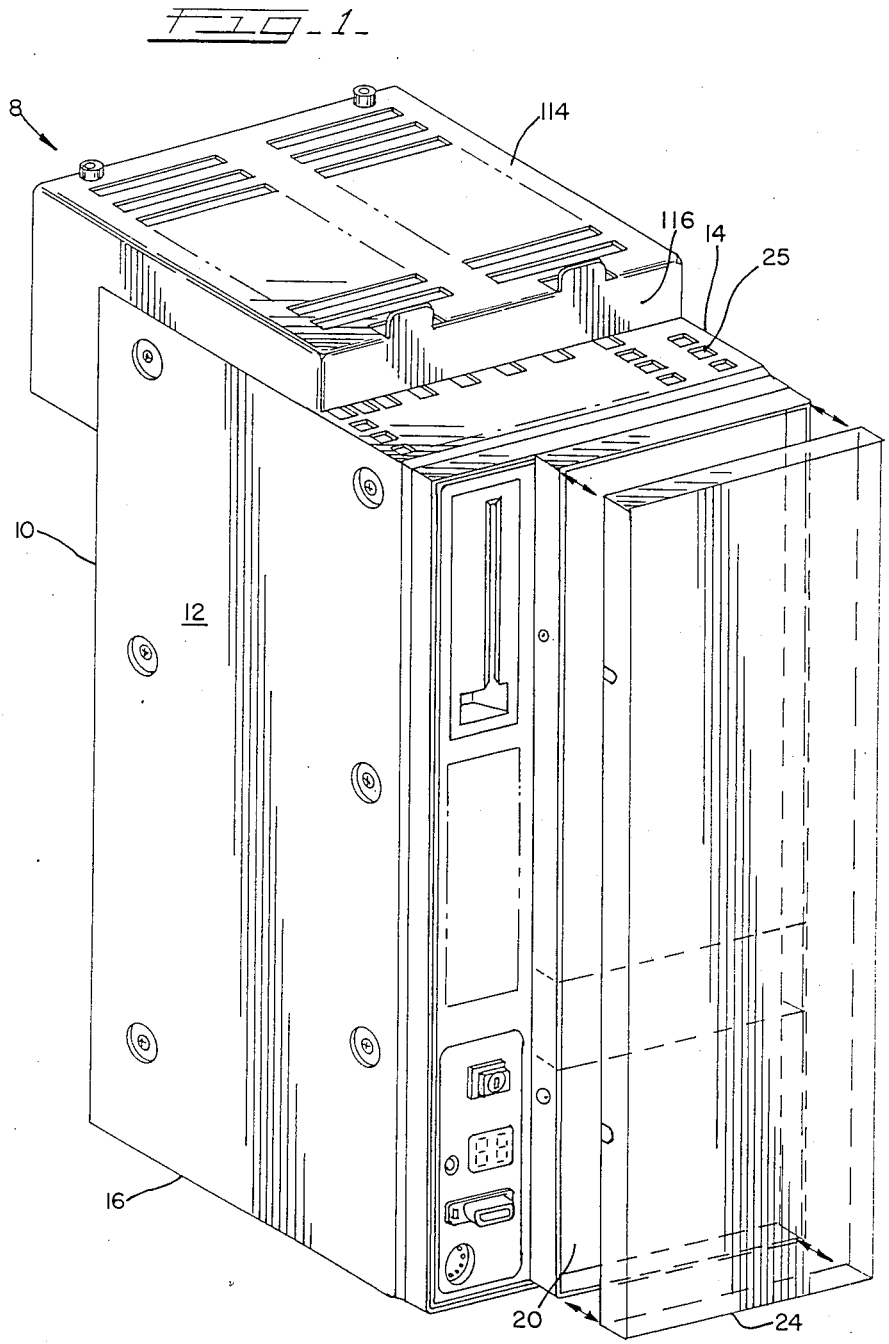

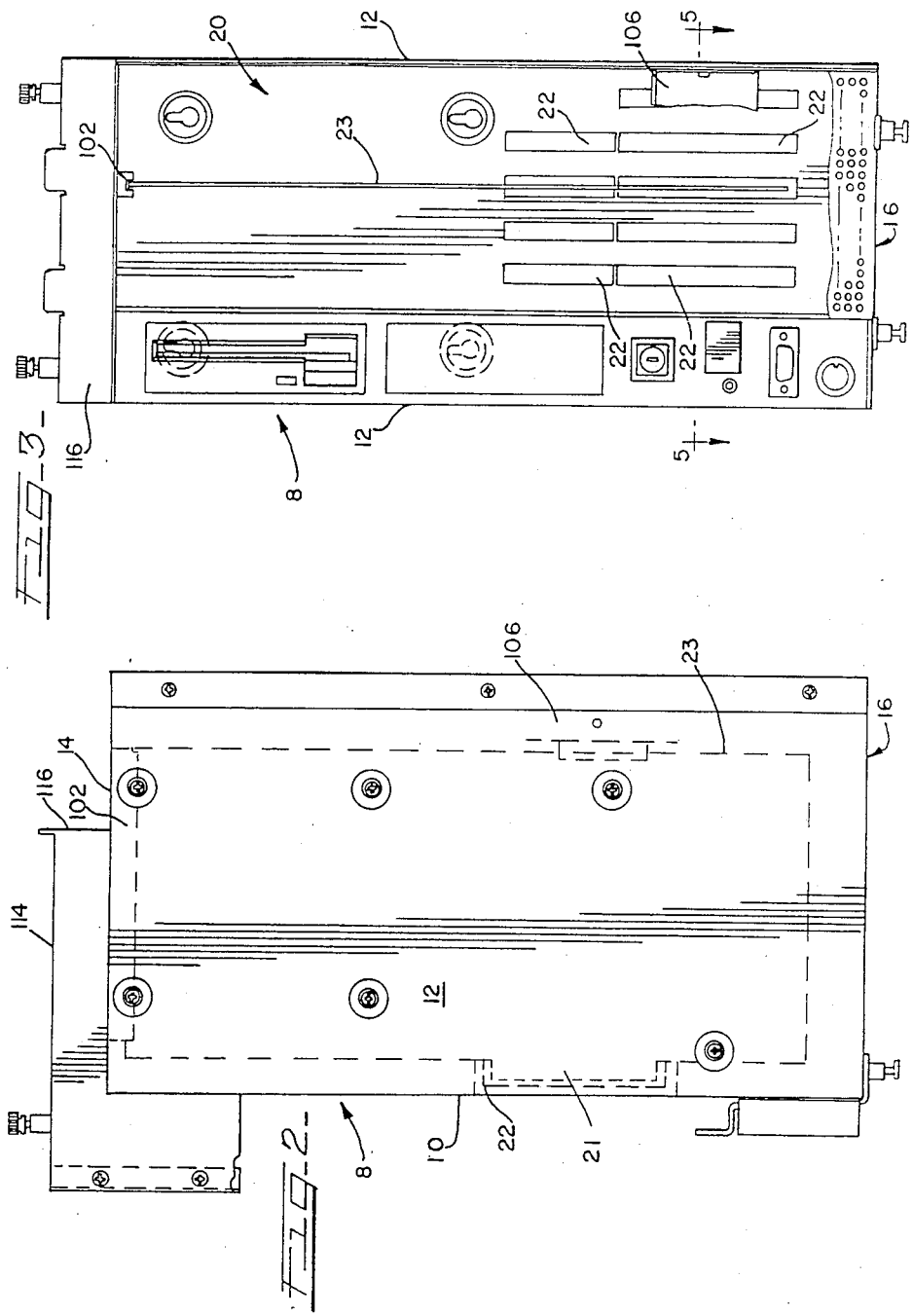

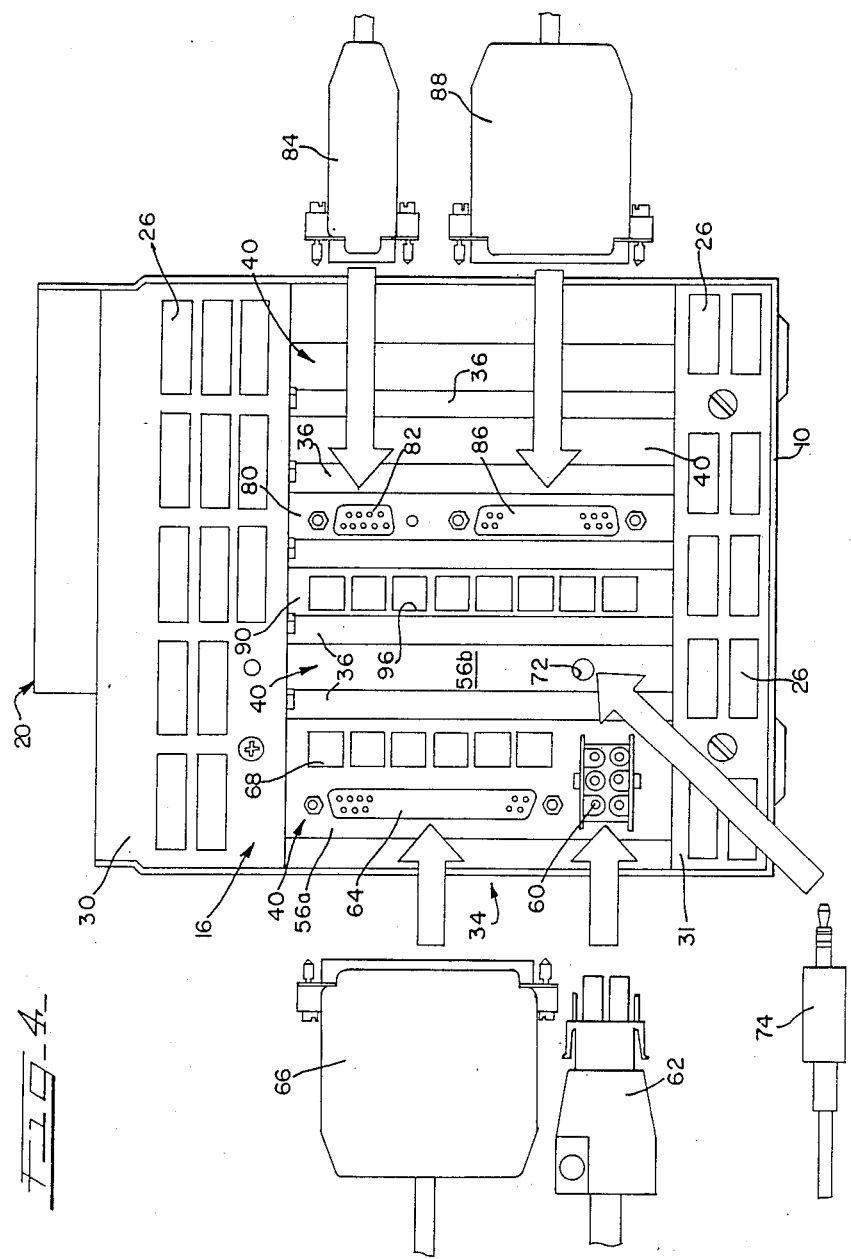

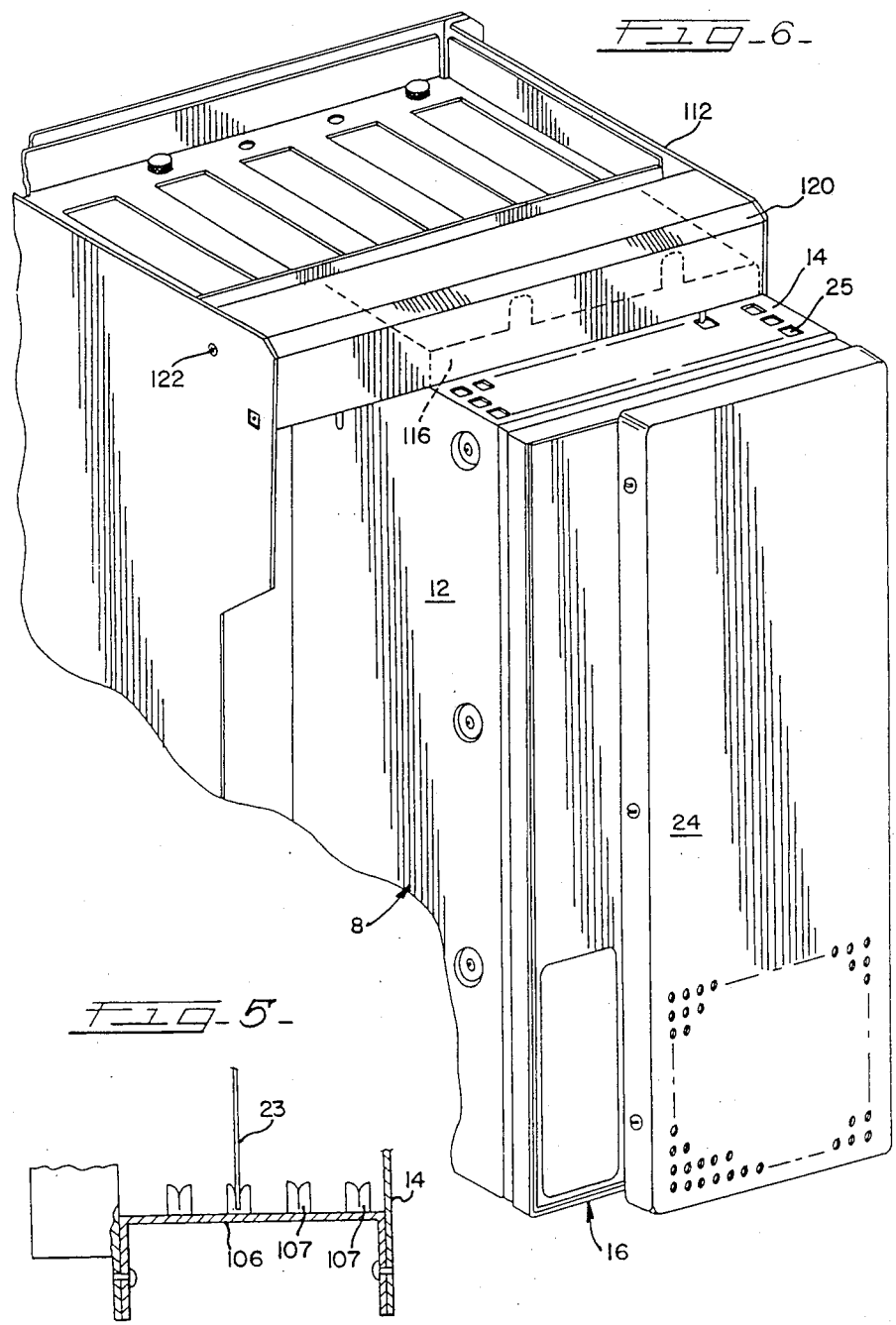

HOUSING FOR A MULTI-BOARD ELECTRONIC MODULE FOR A PROGRAMMABLE CONTROLLER SYSTEM

DESCRIPTION

1. Technical Field

The present invention relates generally to a programmable controller system that is typically used to coordinate and manage operation of a manufacturing plant, and more particulary to a housing for a multi-board electronic module incorporated in such a system.

2. Background Prior Art

A manufacturing cell consists of a group of automated machine controls designed to work together and perform a complete manufacturing or process task. Such manufacturing cells can include a plurality of programmable controller modules, a plurality of I/O modules and/or a plurality of data communication modules.

Cell controller modules have been developed which coordinate and manage operation of a manufacturing cell.

Often such modules must be located near the particular equipment that they are controlling and, therefore, such modules are often located on a plant floor in a less than desirable environment.

Because the electronics within the modules must be cooled, typically the modules have required internal cooling fans, as well as filters, for providing relatively cool ambient air. However filters are a constant source of maintenance, and failure of a fan can result in failure of the associated module.

In addition, often a module can include a plurality of circuit boards Because of the harsh environment in which they must operate, as well as the nature of electronics in general, these circuit boards are subject to failure. As an entire manufacturing cell may depend on operation of a single circuit board, quick removal replacement of a failed circuit board is a necessity.

Still further, the modules are often contained in a housing located in an electrical cabinet on the plant floor However prior housings were difficult to remove from their respective cabinet, greatly limiting flexibility.

The present invention is provided to solve these and other problems.

SUMMARY OF THE INVENTION

It is an object of the invention to provide a housing for a multi-board electronic module of a programmable controller system.

According to the invention, the housing comprises a rear wall, side walls, a top wall and a bottom wall which cooperate to define an enclosure having an open front. A removable cover closes the open front;

Means located in the enclosure are provided for mounting the electronic circuit boards in a substantially vertical orientation.

It is comprehended that the mounting means comprises a plurality of vertically oriented slots located on the rear wall, each of the slots adapted to receive an electrical connecting tab of a corresponding one of the electronic circuit boards and a substantially horizontal securing bracket disposed between the side walls proximate the housing front, the securing bracket including a plurality of elastomeric grooves, one of the grooves corresponding with each of the slots, the grooves adapted to engage and thereby support a corresponding one of the electronic circuit boards.

The housing further includes vent openings in the top and the bottom walls which cooperate with the vertically oriented electronic circuit boards to permit air heated by the electronic circuit boards to escape the housing through the top wall vent openings and for permitting ambient air to enter the bottom wall vent openings The ambient air replaces the escaping air and cools the electronic circuit boards.

It is comprehended that the housing include a cap enclosing a portion of the top wall and a portion of the rear wall, the cap defining mounting support surfaces for the housing.

It is further comprehended that the cap have a front face set back from the housing front and defining an abutment. The abutment is adapted to cooperate with a substantially horizontal latch member of a register rack assembly to retain the housing in the register rack assembly.

Other features and advantages of the invention will be apparent from the following specification taken in conjunction with the following drawings.

BRIEF DESCRIPTION OF DRAWINGS

FIG. 1 is a perspective view of the housing constructed in accordance with the teachings of the present invention;

FIG. 2 is a side view of the housing;

FIG. 3 is a front view of the housing with its cover removed;

FIG. 4 is a bottom view of the housing;

FIG. 5 is a plan view of a bracket for supporting electronic circuit boards within the housing taken along line 5—5 of FIG. 3; and FIG. 6 is a perspective view of the housing mounted in a register rack assembly.

Detailed Description

While this invention is susceptible of embodiment in any different forms there is shown in the drawings and will herein be described in detail a preferred embodiment of the invention with the understanding that the present disclosure is to be considered as an exemplification of the principles of the invention and is not intended to limit the broad aspect of the invention to embodiment illustrated.

This application is related to commonly assigned, co-pending application to Maggelett, et. al., filed 17 Mar. 1989, Ser. No. 325,414 our, the specification of which is expressly incorporated by reference.

A housing, generally designated by reference numeral 8, is illustrated in FIG. 1.

The housing 8 encloses a plurality of circuit boards, discussed below, to produce an electronic module of the type used in a programmable controller system which can be used in multiple configurations to provide substantial system design and functional flexibility. The electronic module can be, for example, a SY/GATE ® Class 8054 Minicell Controller, sold by Square D Company, assignee of this application.

The housing 8 includes a rear wall 10, side walls 12, a top wall 14 and a bottom wall 16. The walls 10, 12, 14 and 16 cooperate to define an enclosure that has an front opening 20 defining a portion of the front wall of the housing 8.

The housing 8 has a plurality of mounting slots 22 adapted to receive an electrical connecting tab 21 each of a plurality of circuit boards 23 (FIGS. 2, 3), each for mounting one of the circuit boards 23 in a vertical orientation within the housing 8, as will be described in greater detail later.

A cover plate 24 (FIG. 1) is provided to cover the front opening 20 after the circuit boards 23 have been mounted in the housing 8.

According to one aspect of the invention, the housing 8 is provided to dissipate heat generated by components on the circuit boards 23 within the housing 8 without a need for cooling fans and filters, which are normally considered mandatory for this type of construction. The heated air naturally rises, and escapes from the housing 8 via upper vents 25 in the top wall 14 (FIG. 1). The heated air is replaced by ambient air which enters the housing via lower vents 26 in the bottom wall 16 (FIG. 4).

Communication ports for connecting the electronic module contained within the housing 8 to other, external devices are located in the bottom wall 16 to limit the amount of space required.

As illustrated in FIG. 4, the bottom wall 16 consists of first and second segments 30, 31 located adjacent to the front opening 20 and the rear wall 10, respectively. Each of the first and second segments 30 31 has a plurality of the lower vents 26.

The bottom wall 16 includes a recess portion 34 between the first and second segments 30, 31, and the recess portion 34 is defined by a plurality of spaced, narrow strips 36 that are spaced from each other to define a plurality of elongated slots 40.

The slots 40 are designed to receive mounting plates 562 and 56b that mount, inter alia, various communication ports.

For example, a first mounting plate 56a is located in a first one of the slots 40 and has a power input port 60 which receives a first plug 62 coupled to a power source (not shown). Also, the first mounting plate 56a has a multi-pin port 64 for receiving a second plug 66 of a portable external floppy disk drive. The first mounting plate 56a preferably also has a plurality of square openings 68 to provide additional ventilation into the housing 8.

The power supply port 60 is electrically connected to internal circuitry (not shown) which converts received AC power to appropriate levels of DC power for internal operation, as is well known in the art.

A second mounting plate 56b has a speaker port 72 therein for receiving a plug 74 that connects to an external speaker (not shown).

Additional ports can be provided wherever desired. For example, a further plate 80 has a monitor port 82 which receives a monitor plug of an EVA monitor while a printer port 86 is adapted to receive a printer plug 88 that forms part of a printer (not shown).

The remaining ones of the slots 40 that are not used for ports can be left open to define an additional inlet for ambient air, or they can be covered by a grill plate 90 which has a plurality of openings 96 therein.

Referring again to FIG. 1, the upper vents 25 are arranged in rows, with a solid section between each row. This solid section is utilized for supporting a plurality of guide members 102 (FIG. 3) that receive upper edges of the circuit boards 23.

As illustrated in FIGS. 2, 3 and 5, a securing bracket 106 extends across the front opening 20. As more specifically illustrated in FIG.(b) 5, the securing bracket 106 has resilient grooves 107 formed of an elastomeric material for receiving the front edge of the circuit boards 23 and maintaining the circuit boards 23 mounted in the housing 8.

In certain applications, the housing 8 is wall mounted, as in an electrical cabinet. In other applications the housing 8 is mounted in a register rack assembly 112, as illustrated in FIG. 6.

Referring to FIG. 1, a cap 114 covers portions of the rear wall 10 and the top wall 14. The cap 114 has a face 116 which forms an abutment.

Referring again to FIG. 6, the face 116 cooperates with a horizontal latch member 120 in the register rack assembly 112 to maintain the housing 8 therein. The horizontal latch member 120 pivots about pivot pins 122 to move from a closed position, as illustrated in FIG. 6, upwardly to an open position. A more detailed description of the register rack assembly 112 and the latch member 120 is contained in the above incorporated, copending application, our Ser. No. 07/325,414.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electronic module of a programmable controller system, said electronic module including a housing to enclose a plurality of electronic circuit boards, said housing comprising:

a rear wall, side walls, a top wall and a bottom wall cooperating to define an enclosure having an open front;

a cap enclosing a portion of said top wall and a portion of said rear wall, said cap adapted for wall mounting of said housing;

a removable cover closing said open front;

an electronic circuit board mounting means located in said housing for mounting said electronic circuit boards in a substantially vertical orientation;

vent openings in said top and said bottom walls, said vent openings and said vertically oriented electronic circuit boards cooperating to permit air heated by components on said electronic circuit boards to escape said housing through said top wall vent openings and for permitting ambient air to enter said bottom wall vent openings, thereby replacing said escaping air and cooling said components on said electronic circuit boards.

2. The electronic module of claim 1 wherein said cap defines mounting support surfaces for said housing.

3. The electronic module of claim 1, wherein said electronic circuit board mounting means comprises:

a plurality of vertically oriented slots located on said rear wall, each of said slots adapted to receive an electrical connecting tab of a corresponding one of said electronic circuit boards; and a substantially horizontal securing bracket disposed between said side walls proximate said housing front, said securing bracket including a plurality of grooves, one of said grooves corresponding with each of said slots, said grooves adapted to engage and thereby support a corresponding one of said electronic circuit boards.

4. The electronic module of claim 3, wherein said grooves are made of an elastomeric material.

5. An electronic module of a programmable controller system, said electronic module including a housing to enclose a plurality of electronic circuit boards and for placement in a register rack assembly, said housing comprising:
 a rear wall, side walls, a top wall and a bottom wall cooperating to define an enclosure having an open front;
 a cap covering a portion of said top wall and said rear wall, said cap having a front face set back from said housing front and defining an abutment, said abutment adapted to cooperate with a substantially horizontal latch member of said register rack assembly to retain said housing in said register rack assembly.

6. The electronic module of claim 5, said housing of said electronic module including a removable cover closing said open front; and
 an electronic circuit board mounting means located in said housing for mounting said electronic circuit boards in a substantially vertical orientation.

7. The electronic module of claim 5, said housing of said electronic module including vent openings in said top and said bottom walls, said vent openings and said vertically oriented electronic circuit boards cooperating to permit air heated by components on said electronic circuit boards to escape said housing through said top wall vent openings and for permitting ambient air to enter said bottom wall vent openings, thereby replacing said escaping air and cooling said components on said electronic circuit boards.

* * * * *